July 13, 1971 M. K. STELTER 3,592,691

PHOTORESIST REMOVAL METHOD

Filed July 11, 1968

WITNESSES

Theodore F. Wrobel

James F. Young

INVENTOR

Manfred K. Stelter

BY Lee P. Johns

ATTORNEY

United States Patent Office 3,592,691

Patented July 13, 1971

3,592,691

PHOTORESIST REMOVAL METHOD

Manfred K. Stelter, Greensburg, Pa., assignor to Westinghouse Electric Corporation, Pittsburgh, Pa.

Filed July 11, 1968, Ser. No. 744,053
Int. Cl. B08b 3/10
U.S. Cl. 134—42 2 Claims

ABSTRACT OF THE DISCLOSURE

The method of removing a photoresist layer after photo processing from a semiconductor substrate including the steps of immersing a substrate containing residuals of photoresist masks into a photoresist solvent and heating the solvent to a temperature ranging from about 150° to 250° C. while subjecting the solvent to a pressure of about 300 p.s.i.g. for a time period of from about one-quarter up to three hours.

BACKGROUND OF THE INVENTION

Field of the invention

This invention relates to a process for removing photoresist mask residuals from a semiconductor substrate.

Description of the prior art

One of the most difficult steps in photochemical processing is the proper adhesion and etch resistance of the photoresist mask to the substrate and the complete removal of the mask after the selective processing has been accomplished. To improve their adhesion and etch resistance the photoresist masks are preferably subjected to an extended post-baking cycle which causes the resist to harden (cross-polymerization) to such a degree that subsequent removal or stripping of the resist from the substrate is only possible by the use of strong solvents. Strong oxidizing solvents for dissolving the photoresist masks have the disadvantage of affecting the substrate such as corroding metallized portions and damaging the silicon wafer.

In addition to the foregoing other disadvantages occur in most prior procedures for removing photoresist masks. They include damaging and breakage of the substrates in an effort to remove remaining residuals of undissolved resist masks. Moreover, manual swabbing of the substrate surface results in an unreliable and more costly procedure.

It has been found in accordance with this invention that the foregoing disadvantages may be overcome by subjecting a substrate having a coating of a photoresist material thereon to an organic solvent which has been heated to a temperature ranging from 150° to 250° C. for a period of time up to about 3 hours and at a pressure of up to about 300 p.s.i.g. in order to completely remove the photoresist material from the substrate.

Accordingly, it is an object of this invention to provide a photoresist removal method which produces a greater yield than prior known methods.

It is another object of this invention to provide a photoresist removal method which avoids damage and breakage to the substrate.

It is another object of this invention to provide a photoresist removal method which is complete, reliable, and expedient.

Finally, it is an object of this invention to satisfy the foregoing objects and desiderata in a simple and effective manner.

SUMMARY OF THE INVENTION

Generally, the method of the present invention involves immersing a semiconductor substrate having a mask of photoresist mask material on at least one surface thereof into a solution of an organic solvent, and heating the solution to a temperature ranging from about 150° to 250° C. for a period of up to 3 hours at a pressure of up to 350 p.s.i.g.

BRIEF DESCRIPTION OF THE DRAWINGS

For a better understanding of the invention reference is made to the appended drawings in which.

Similar numerals refer to similar parts throughout the several views of the drawings.

DESCRIPTION OF THE PREFERRED EMBODIMENTS

Figure 1:
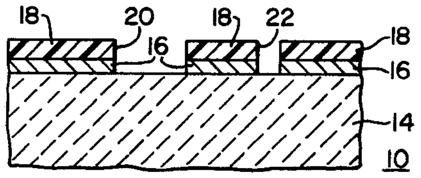
FIG. 1 is a fragmentary sectional view of a substrate having an inner layer of a metal coating and an outer layer of a photoresist masking which layers have been etched.
Figure 2:
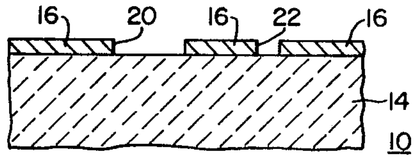
FIG. 2 is a view of the substrate shown in FIG. 1 from which the outer layer of photoresist mask has been removed in accordance with this invention.
Figure 3:
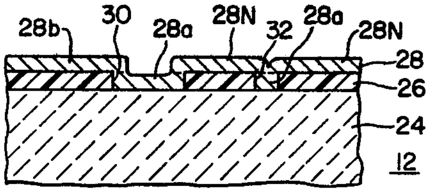
FIG. 3 is a fragmentary sectional view of a semiconductor substrate having an inner layer of photoresist mask on the surface thereof and having an outer layer of the metal coating which has been deposited on the surface of the resist mask as well as on the substrate surface where holes exist in the mask.

In FIGS. 1 and 3 portions of two different semiconductor devices 10 and 12 are shown in intermediate stages of production. The device 10 in FIG. 1 includes a substrate 14, a metal coating 16, and a mask 18 of hardened resist. The device 10 is in the stage of production subsequent to etching (as shown in FIG. 1) whereby spaced holes 20 and 22 are provided in the coating 16 and the mask 18. After etching to provide the holes 20 and 22, the mask 18 is removed to expose the metal coating 16 in the final product as shown in FIG. 2.

The substrate 14 is composed of a glass or other materials, such as silicon dioxide or silicon, depending upon the particular application of the device 10. The metal layer 16 is composed of a conventional metal such as, for example, chromium, nickel, and copper.

The mask 18 is composed of photoresist materials comprising an organic solvent-soluble material that is polymerizable, such as a rubber and a sensitizer. U.S. Pat. No. 2,852,379 is referred to for further information on such materials including their composition, preparation, and use. One such photoresist material that has been successfully treated is manufactured by the Eastman Kodak Company and sold under the name Kodak Metal Etch Resist or KMER. This photoresist material is believed to be basically a butadiene-styrene rubber compound in a solvent with a photosensitive activator suspended therein.

In FIG. 3 the device 12 includes a substrate 24, a mask 26, and metal coating 18. The materials of all of the parts 24, 26, and 28 corresponds substantially with those of the materials 14, 18, and 16, respectively, of the device 10.

Inasmuch as the mask 26 is disposed between the substrate 24 and the metal layer 28 the latter is applied (such as by evaporation deposition) after suitable holes 30 and 32 have been etched into the mask 26. The metal coating 28 covers the entire surface of the device 12 and includes portions 28$a$ and 28$b$, the former of which is disposed on the surface of the substrate 24 and within the holes 30 and 32, and the latter of which is disposed on the top side of the mask 26. The portions 28*b* on the mask 26 are more porous than the portions 28*a* because the former are deposited on the surface of the substrate 24. For that reason a photoresist solvent penetrates the coating portions 28*b* and permeates the mask 26. As the reaction between the solvent and mask proceeds, the mask swells and causes the portions 28*b* to separate from the portions 28*a*, leaving the latter remaining on the surface of the substrate as shown in FIG. 4.

Figure 4:
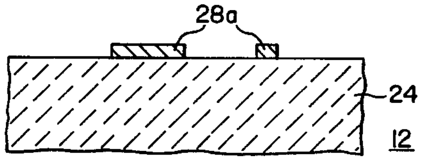
FIG. 4 is a sectional view showing the substrate of FIG. 3 after the resist and excess metal coating have been removed in accordance with this invention.

The purpose of the present invention is to removal all traces of the mask 18 (FIG. 1) and mask 26 (FIG. 3) so as to provide the products 10 and 12 as shown in FIGS. 2 and 4, wherein spaced areas of the metal layers 16 (FIG. 2) and 28*a* (FIG. 4) remain intact on the surfaces of the substrates 14 and 24, respectively.

The devices 10 and 12 are therefore immersed in an organic solvent, heated to a temperature ranging from about 150° to 250° C. for a period of from about one-quarter to three hours, and simultaneously subjected to a pressure ranging from 150 to 350 p.s.i.g. with best results being obtained about 300 p.s.i.g.

Figure 5:
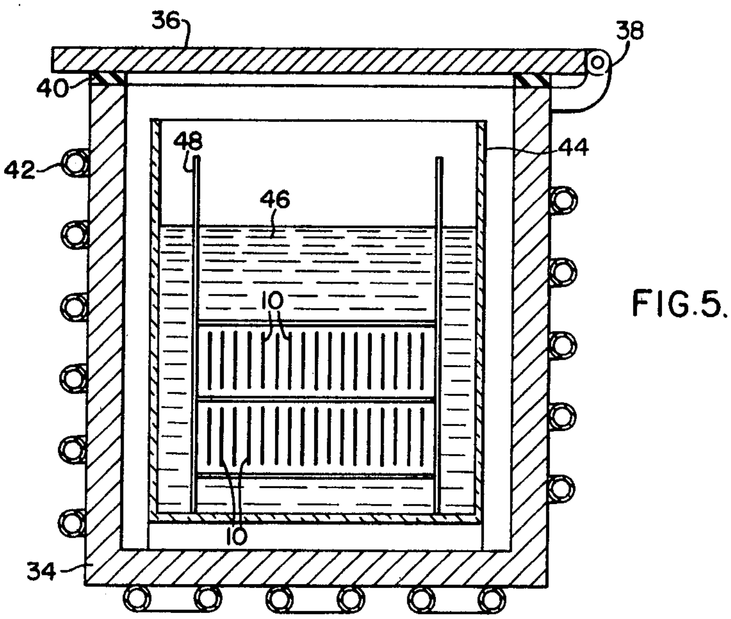
FIG. 5 is a schematic sectional view of an autoclave having a hingedly mounted cover and adapted for containing a rack for mounting a plurality of substrates.

One way of subjecting the devices 10 and 12 to those conditions is to provide an autoclave 34 (FIG. 5) having a detachable cover 36 which is hinged mounted at 38 and which is sealed to the autoclave by an annular seal 40. The autoclave is preferably provided with means, such as coils 42, for heating and cooling the autoclave interior. The interior is provided with a suitable liner 44, such as glass, which contains a solvent 46 of an organic material. A plurality of devices 10 or 12 are mounted on a rack 48 so that the devices can be completely immersed within the solvent 46.

The solvent 46 is heated within the autoclave to a temperature ranging from about 150° to 250° C. for a period of time varying from about one-quarter hour to three hours and the pressure within the autoclave 34 is increased to about 300 p.s.i.g. primarily for the purpose of preventing the constituents of the solvent 46 from evaporating.

The solvent 46 is preferably composed of at least one organic material selected from a group consisting of xylene (for example m-xylene and/or o-xylene) and may include up to a few percent of methylene chloride, and a mixture of trichlorethylene, isopropanol, and xylene with methylene chloride. A xylene mixture that has been found satisfactory included about 98% (by volume) of xylene and about 2% (by volume) of methylene chloride. Likewise, a satisfactory mixture of trichloroethylene contains about 300 parts by volume of trichloroethylene, about 50 parts of isopropanol, and about 400 parts of a mixture of about 98% (by volume) xylene and of about 2% (by volume) methylene chloride. The methylene chloride may be replaced in whole or in part with other chlorinated aliphatic hydrocarbons of low boiling point. The isopropanol may be replaced wholly or partially with low boiling point aliphatic alcohols such as ethyl alcohol.

It has been found that the stronger the mechanical bond (which is dependent upon the cross-polymerization of the copolymers contained in the photoresist material), the stronger the solvent required for removing the photoresist from the substrate. Moreover, higher boiling temperatures are more effective, such as 240° C. instead of 200° C. For example, as shown in the table the solvent (C) is stronger than the solvent (A).

A preferred temperature for removal of the photoresist is 240° C. at which temperature a minimum time of about 15 minutes is required. If higher temperatures than 250° C. are used, the surface of the substrate has an undesirable charcoal-like appearance.

At the preferred temperature of about 240° C. the photoresist mask is readily removed without resorting to any mechanical swabbing. In the past swabbing has had detrimental effects such as cracking of the wafers and scratching of the surface of the substrate.

A series of experiments were made using three different solvent combinations on five types of substrates or wafers coated with photoresist masks. All of the wafers were cleaned in solvents containing either detergent, trichloroethylene, or nitric acid before coating and then heated to a temperature of 240° C. for 30 minutes to "bake-out" the wafers. The wafers were then coated on a Headway Research spinner at 800 r.p.m. to apply a photoresist coating thickness of approximately 20,000 angstroms. The coated wafers wher then prebaked at 100° C. for 15 minutes after which the wafers were exposed for 30 minutes to ultraviolet rays of a 500 watt sun-gun with a heat filter (such as made by Sylvania Electric Company) at a distance of 12 inches. The wafers were then spray-developed using an isopropanol mask-thinner rinse. After drying in a nitrogen gas atmosphere, the wafers were post-baked for 30 minutes at 150° C. to improve the etch resistance.

The detailed layout for the experiments are shown in the table.

TABLE.—RESULTS ON "AUTOCLAVE STRIPPING" USING DIFFERENT SOLVENT COMBINATIONS AND PROCESSES

| Experiment | (A) Thinner [1] (200° C., max. solvent temp.) | | (B) Xylene (240° C. max. solvent temp.) | | (C) Trichloroethylene 300,[2] isopropanol 50, thinner [1] 400 240° C. max. solvent temp. | |
|---|---|---|---|---|---|---|
| | Percent of total area stripped | Detail of area stripped | Percent of total area stripped | Detail of area stripped | Percent of total area stripped | Detail of area stripped |
| I. Si wafers coated exposed, developed, baked, mesa etched. | 50 | No visual residue | 50 | No visual residue at 1,000×. | 100 | No visual residue at 1,000×. |
| II. Si wafers oxidized, coated, exposed, baked, oxide, window etched. | 50 | Small specks of residue at 100×. | 80 | No visual residue at 1,000×. | 100 | No visual residue at 1,000×. |
| III. Si wafers Ni plated, coated, exposed, baked, Ni etched. | 50 | No visual residue at 100×. | 50 | No visual residue at 100×. | 100 | No visual residue at 1,000×. |
| IV. Si wafers on Mo-support, shunt etched | 100 | No visual residue at 1,000×. | 100 | No visual residue at 1,000×. | 100 | No visual residue at 1,000×. |
| V. Al plates coated, exposed, developed, baked, mesa etched. | 100 | No visual residue at 1,000×. | 100 | No visual residue at 1,000×. | 100 | Al discolored. |

[1] 98% xylene and 1–2% methylene chloride. [2] Parts by volume.

Some wafers (Experiments I, III, and IV) listed in the table were mesa etched in a solvent containing 15 parts of $HNO_3$, 5 parts of HF, and 3 parts of $H_3C_2OOH$ at 4° C. for 2.5 minutes. Other wafers (Experiment II) were oxide etched for 12 minutes in a 6 to 1 solution of $(NH_4)_2F_2$ 60% and $H_2F_2$ (conc.). Still other wafers (Experiment V) were etched in 20% NaOH for 10 minutes.

All wafers were thoroughly rinsed and dried in air after etching. Each group of wafers were loaded in a boat and immersed in the corresponding solvent within a beaker. The boat and beaker are composed of a suitable material such as polytetrafluoroethylene which is made and sold by the Du Pont Company under the trademark Teflon. The beakers were placed in a 2000 ml. Parr autoclave and backfilled to 100 p.s.i.g. with nitrogen. The autoclave was then heated to 240° C. at a pressure of 300 p.s.i.g. and then cooled to room temperature and the pressure was relieved. The wafers were blown dry in nitrogen and optically examined for residual photoresist material at magnifications of from 100 to 1000×. Several wafers of the Experiment IV were processed through metallization and encapsulated. Their electrical characteristics were identical or better than the "hand-stripped" group.

Accordingly, autoclave stripping is a useful means for removing post-baked photoresist masks from delicate substrates without need for physical scrubbing and brushing. Not only does such a procedure greatly reduce the cost of stripping but there is the advantage of eliminating possible physical damage to the wafer by scrubbing coupled with the possibility of processing a large number of wafers simultaneously.

While the best known embodiments of the invention have been illustrated and described in detail, it is understood that the invention is not limited thereto or thereby.

What is claimed is:

1. A method for removing a photoresist from a substrate comprising the steps of immersing a photoresist coated substrate in an organic solvent consisting essentially by volume of about 98% of xylene and of about 2% of methylene chloride, and heating the solvent to a temperature ranging from about 150° C. up to but not materially exceeding 250° C. for a time period of from about ¼ to 3 hours at a pressure of about 300 p.s.i.g., whereby swabbing is unnecessary.

2. A method for removing a photoresist from a substrate comprising the steps of immersing a photoresist coated substrate in an organic solvent consisting essentially by volume of 300 parts of trichloroethylene, 50 parts of isopropanol, and 400 parts of a mixture of 98% of xylene and of 2% of methylene chloride, and heating the solvent to a temperature ranging from about 150° C. up to but not materially exceeding 250° C. for a time period of from about ¼ to 3 hours at a pressure of about 300 p.s.i.g., whereby swabbing is unnecessary.

References Cited

UNITED STATES PATENTS

| | | | |
|---|---|---|---|
| 1,891,197 | 12/1932 | Andrews | 134—42X |
| 2,079,489 | 5/1937 | Cole | 134—19UX |
| 2,852,379 | 9/1958 | Hepher et al. | 96—33X |
| 3,005,740 | 10/1961 | Halko | 252—364X |
| 3,071,178 | 1/1963 | Howeth | 134—19X |
| 3,121,009 | 2/1964 | Giaimo | 134—38UX |
| 3,340,199 | 9/1967 | Clay et al. | 252—364X |
| 3,357,828 | 12/1967 | Moe | 252—364X |
| 3,400,077 | 9/1968 | Orfeo et al. | 252—364X |

OTHER REFERENCES

Drakos et al., Modern Plastics, vol. 42, No. 1A, 1964, pp. 402–4.

JOSEPH SCOVRONEK, Primary Examiner
D. G. MILLMAN, Assistant Examiner

U.S. Cl. X.R.

134—38; 252—162, 170, 364